US008653359B2

(12) United States Patent
Sheng

(10) Patent No.: US 8,653,359 B2
(45) Date of Patent: Feb. 18, 2014

(54) SOLAR ENERGY DEVICE AND USING METHOD OF THE SAME

(75) Inventor: Yen-Long Sheng, New Taipei (TW)

(73) Assignee: Getac Technology Corporation, Hsinchu (TW)

(*) Notice: Subject to any disclaimer, the term of this patent is extended or adjusted under 35 U.S.C. 154(b) by 142 days.

(21) Appl. No.: 13/244,570

(22) Filed: Sep. 25, 2011

(65) Prior Publication Data

US 2013/0074909 A1   Mar. 28, 2013

(51) Int. Cl.
*H01L 31/042* (2006.01)
*H02N 6/00* (2006.01)
*H01L 31/05* (2006.01)

(52) U.S. Cl.
CPC ............... *H01L 31/05* (2013.01); *H01L 31/042* (2013.01); *Y02E 10/50* (2013.01)
USPC ........................................................ 136/251

(58) Field of Classification Search
CPC ............................... H01L 31/042; H01L 31/05
USPC .................................................. 136/244, 251
See application file for complete search history.

(56) References Cited

U.S. PATENT DOCUMENTS

| 6,066,796 | A  | * | 5/2000  | Itoyama et al. ............... 136/251 |
| 6,606,830 | B2 | * | 8/2003  | Nagao et al. ................. 52/173.3 |
| 7,713,089 | B2 | * | 5/2010  | Faust et al. ............... 439/620.21 |
| 2008/0271774 | A1 | * | 11/2008 | Kalkanoglu et al. .......... 136/244 |

FOREIGN PATENT DOCUMENTS

TW           M400661           3/2011

* cited by examiner

*Primary Examiner* — Eli Mekhlin

(57) ABSTRACT

A solar energy device including at least one solar energy module and a connecting structure is provided. The connecting structure includes a body and a connecting belt. The body assembled to the solar energy module has a recess. The connecting belt has a first end, a second end, and a connecting protruding configured at the second end, wherein the first end connects to the body. A using method of the solar energy module is also provided.

13 Claims, 3 Drawing Sheets

US 8,653,359 B2

SOLAR ENERGY DEVICE AND USING METHOD OF THE SAME

BACKGROUND OF THE INVENTION

1. Field of the Invention

The present invention relates to a solar energy device, and particularly to a solar energy device having a connecting structure.

2. Description of Related Art

With the consideration of environmental protection in recent years, the developments of alternative energy and renewable energy have become popular in response to the shortage of fossil energy and to reduce the impact on environment caused by the use of fossil energy. Herein, photovoltaic cells attract the most attention among the alternative energy and renewable energy. Photovoltaic cells are capable of converting solar energy into electric energy directly without polluting the environment by generating hazardous substances such as carbon dioxide or nitride in the power generation process.

However, a complicated structure and comparatively more components are required to dispose the solar energy devices to the stage. As a result, the cost of facilitating solar energy by man power and the required components cannot be effectively reduced. Furthermore, most of the supporting components used for mounting the solar energy devices are in rigid structure, and it may lead to the plurality of solar energy devices being restricted to a plane after they are connected to each other, and any appropriate change along with the environmental topography where the solar energy devices are located cannot also be available. Thus, how to effectively simplify the supporting components into a unit and reduce the disposing time, and improve the adaptation of the solar energy device to the environmental topography are the issues deserved further research.

SUMMARY OF THE INVENTION

The present invention provides a solar energy device and the using method thereof, having a connecting structure adapted to the profile of the environmental topography.

One embodiment of the present invention provides a solar energy device including at least one solar energy module and a connecting structure. The connecting structure includes a body and a connecting belt. The body is assembled to the solar energy module, wherein the body has a first recess. The connecting belt has a first end, a second end and a connecting protruding located at the second end, wherein the first end is connected to the body.

One embodiment of the present invention provides a using method of a solar energy device adapted to connect the plurality of solar energy devices to each other. Each solar energy device includes a solar energy module and at least one connecting structure assembled to the solar energy module. The connecting structure includes a body, a connecting belt and a pair of electrodes, wherein the body has a first recess, the connecting belt has a first end, a second end and a connecting protruding located at the second end, wherein the first end is connected to the body. The pair of electrodes are respectively disposed at the first recess and the connecting protruding, and electrically connected to the solar energy module. The using method of the solar energy device includes fastening the connecting protruding of one of the solar energy devices in the first recess of another solar energy device, so that the solar energy devices are connected to each other.

According to an embodiment of the present invention, the solar energy device further includes a pair of electrodes respectively disposed at the first recess and the connecting protruding, and electrically connected to the solar energy module.

According to an embodiment of the present invention, the solar energy device includes a plurality of solar modules and a plurality of connecting structures. The connecting structures are disposed at the solar energy modules, and the connecting protruding disposed on one of the solar energy modules is fastened to the first recess located at another solar energy module so that the solar energy modules are electrically connected to each other.

According to an embodiment of the present invention, the body has a second recess, and the second end and the connecting protruding are detachably buried in the second recess.

According to an embodiment of the present invention, the first recess and the second recess are respectively located at opposite sides of the solar energy module.

According to an embodiment of the present invention, the first recess is located at a light receiving surface of the solar energy module.

According to an embodiment of the present invention, the shape of the connecting protruding is matched with the shape of the first recess and the shape of the second recess.

According to an embodiment of the present invention, when the connecting protruding is fastened to the first recess or the second recess, the distance between the connecting protruding and the solar energy module is smaller than the distance between the top of the first recess of the body and the solar energy module, or is smaller than the distance between the top of the second recess of the body and the solar energy module.

According to an embodiment of the present invention, the solar energy module has at least one corner, and the body encloses the corner.

In an embodiment of the present invention, the body is consisted of a buffer material.

According to an embodiment of the present invention, the connecting belt is flexible.

In one embodiment of the present invention, the body further has a second recess. The first recess is located at a light receiving surface of the solar energy module. The second recess is located at a back-lighted surface of the solar energy module. And the connecting protruding is detachably buried in the second recess. The using method of the solar energy device further includes detaching the connecting protruding from the second recess located at the back-lighted surface so as to fasten to the first recess of another solar energy device.

In light of the above, in the embodiment of the present invention, through the connecting structures disposed at the corners of the solar energy module, the solar energy module is protected due to the buffer effect. By using the configuration of the connecting protruding disposed on the connecting belt of the connecting structure and the recess portions of the body, the adjacent solar energy modules can be connected to each other, and the plurality of the solar energy modules are further electrically and/or physically connected together through the connecting structure.

In order to make the aforementioned and other features and advantages of the invention more comprehensible, embodiments accompanying figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1:
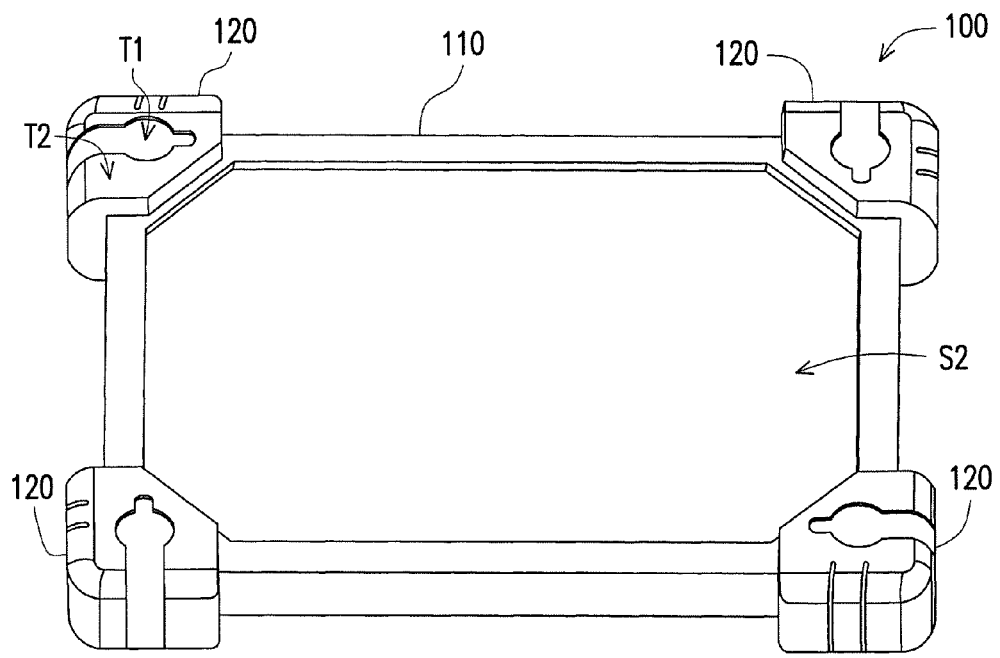
FIG. 1 is a schematic view of a solar energy device according to one embodiment of the present invention.
Figure 2:
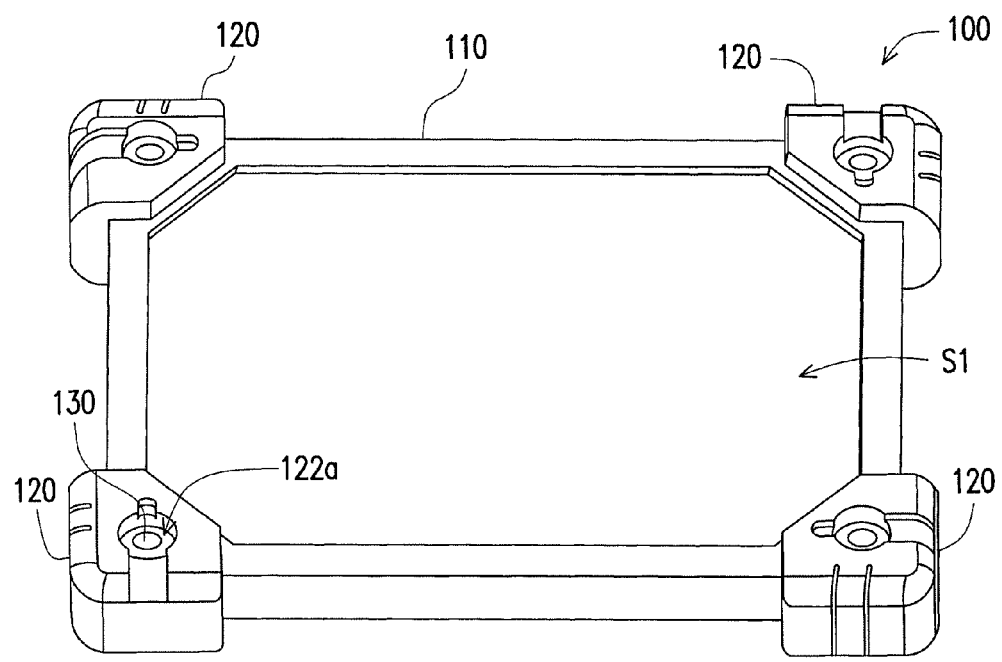
FIG. 2 is a schematic view illustrating the solar energy device of FIG. 1 from another view angle.
Figure 3:
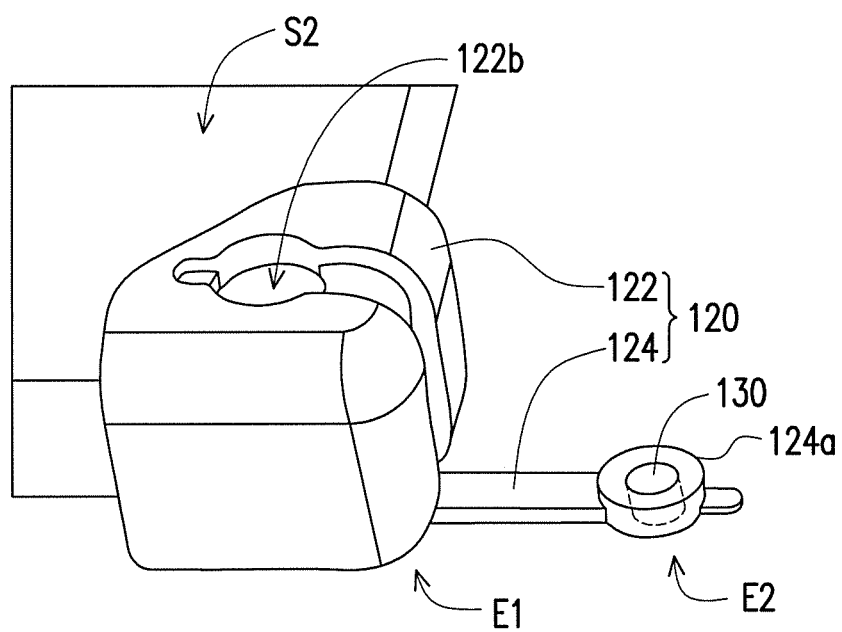
FIG. 3 is a schematic partially enlarged view illustrating the solar energy device of FIG. 1 being in another state.

FIG. 1 is a schematic view of a solar energy device according to one embodiment of the present invention. FIG. 2 is a schematic view illustrating the solar energy device of FIG. 1 from another view angle. FIG. 3 is a schematic partially enlarged view illustrating the solar energy device of FIG. 1 being in another state. Referring to FIG. 1 to FIG. 3, in the present embodiment, the solar energy device 100 includes a solar energy module 110 and a plurality of connecting structures 120. Herein, the solar energy module 100 has a rectangular body and each of the connecting structures 120 is respectively disposed at the four corners of the solar energy module 110. However, in other embodiments not shown in figures, the solar energy module can be in other different geometric shapes as required, and the shapes and the configuration of the connecting structures are not limited by the present invention.

In the present embodiment, the connecting structure 120 is consisted of a buffer material (e.g., rubber) including a body 122 and a connecting belt 124. The body 122 encloses the corners of the solar energy module 110 so as to achieve the buffer effect and protection to the solar energy module 110. That is, regardless of the shape of the solar energy module 110, the connecting structure 120 and the body 122 have the functions of providing a buffer effect, protection from impact and a cushion effect to the solar energy module 110.

The connecting belt 124 has a first end E1, a second end E2 and a connecting protruding 124a located at the second end E2. The first end E1 of the connecting belt 124 is connected to the body 122. It means that the body 122 and the connecting belt 124 can be integrally formed in the manufacturing process of the connecting structure 120. Herein the solar energy module 110 has a light receiving surface S1 and a back-lighted surface S2 opposing to the light receiving surface S1. The body 122 has a first recess 122a and a second recess 122b opposing to the first recess 122a, wherein the first recess 122a is located at the light receiving surface S1 of the solar energy module 110, the second recess 122b is located at the back-lighted surface S2 of the solar energy module 110, and the first end E1 of the connecting belt 124 is connected to the body 122 located at the light receiving surface S1 and located beside the first recess 122a. When the solar energy device 100 is operating in that state showing in FIG. 1 (i.e., the solar energy device 100 includes only one solar energy module 110), the connecting belt 124 is detachably embedded in the second recess 122b so that the connecting belt 124 has the same surface profile with the body 122. However, the absolute disposing locations between the recesses 122a, 122b and the connecting belt 124 of the solar energy module 110 are not limited by the present invention.

Figure 4:
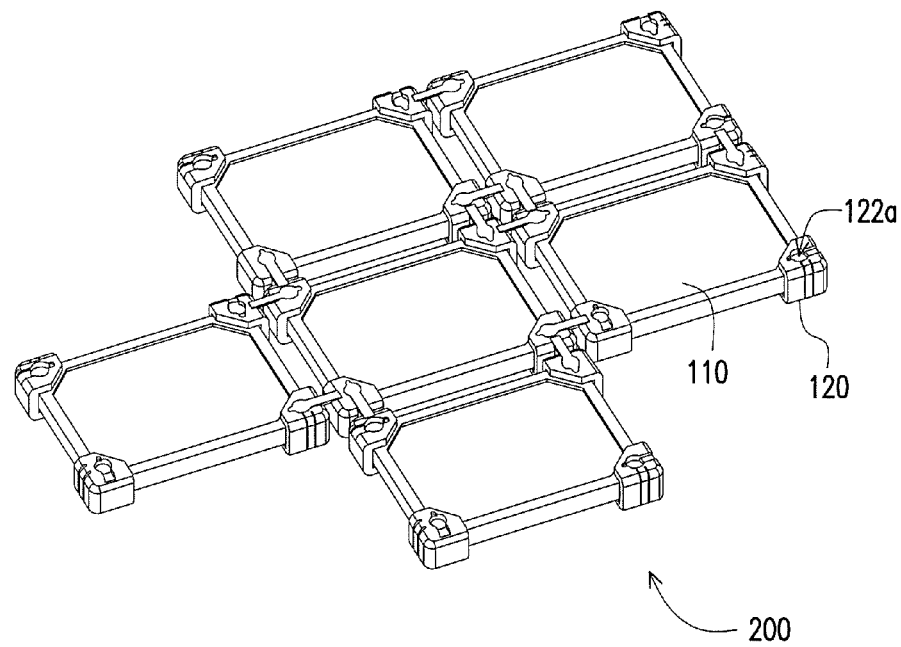
FIG. 4 is a schematic view of a solar energy device according to another embodiment of the present invention.
Figure 5:
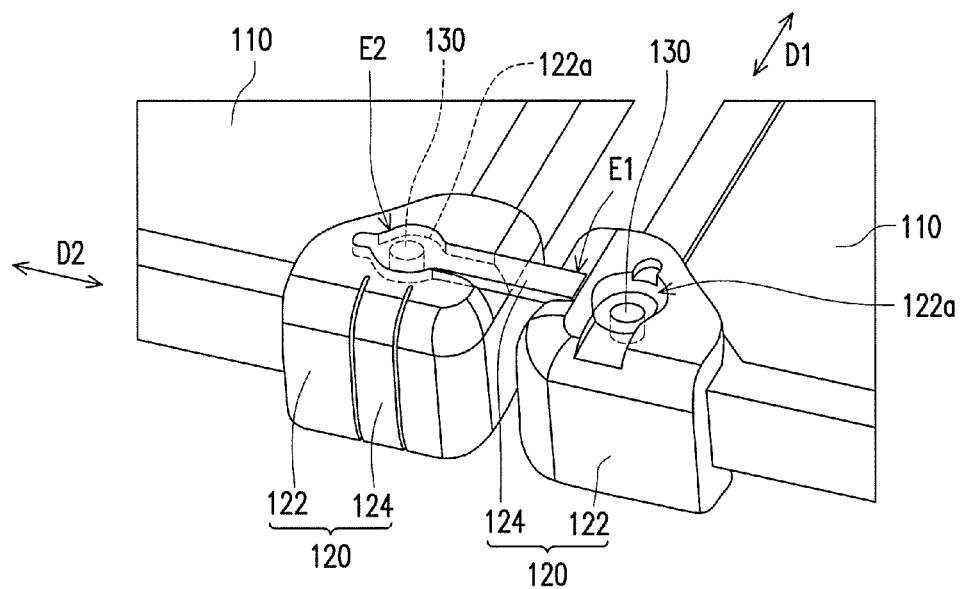
FIG. 5 is a schematic partially enlarged view illustrating the solar energy device of FIG. 4.

FIG. 4 is a schematic view of a solar energy device according to another embodiment of the present invention. FIG. 5 is a schematic partially enlarged view illustrating the solar energy device of FIG. 4. Referring to FIG. 4 and FIG. 5, in the present embodiment, the solar energy device 200 includes a plurality of solar energy modules 110 and a plurality of connecting structures 120 disposed on the solar energy modules 110. Likewise, the connecting structures 120 thereof not only have the functions of providing a buffer effect, protection from impact and a cushion effect to the solar energy module 110 as mentioned above embodiment, also can connect multiple solar energy modules 110 together through the connecting structures 124.

More specifically, when any two of the solar energy modules 110 have to be connected together, the connecting belt 124 has to be detached from the second recess 122b first (as shown in FIG. 3), and then the connecting protruding 124a located at the second end E2 has to be fastened to the first recess 122a of another solar energy module 110 (as shown in FIG. 4). Accordingly, the structural connection of the solar energy modules 110 is completed. In other words, since the profiles of the connecting belt 124 of each connecting structure 120 and the connecting protruding 124a are respectively matched with the profile of first recess 122a and the second recess 122b thereof, the different solar energy modules 110 can be connected together with their connecting structures 120.

Please refer to FIG. 5 again. In order to connect the solar energy modules 110 together as shown in the status of FIG. 4, on the same connecting structure 120, the orthogonal projections to the plane where the solar energy module 110 is located of the extension direction D1 of the connecting belt 124 (i.e., the extension direction of the second recess 122b) and the extension direction D2 of the first recess 122a are perpendicular to each other. As such, the neighboring four solar energy modules 110 can be connected together by connecting the connecting belts 124 end to end, and such connection can be continuously expanded. However, the present invention is not limited thereto. In other embodiments not shown in figures, the connecting structures can be collocated with the profiles of solar energy modules and a plurality of solar energy modules can be connected together through the connecting method mentioned above.

It should be noted that, in the embodiment, the solar energy modules 110 after being connected are not restricted to be on the same plane by the connecting structures 120. Instead, the in-between of the solar energy modules 110 after being connected are in a floating state since the material of the connecting belt 124 is flexible. In other words, the solar energy device 200 after being connected is not a rigid structure. By contrast, the solar energy device 200 can be adaptable to various profiles of rugged surface due to the flexibility of the connecting belt 124. It means that the solar energy device 200 of the present invention can be adaptive to different profiles of the surface where the solar energy device 200 is assembled while the height of solar energy device varies with different terrains. Compared to the conventional solar energy device fabricated with rigid supporting components, the solar energy device 200 of the present invention is more adaptable.

Please refer to FIG. 2, FIG. 3 and FIG. 5 again. On the other hand, the solar energy device 200 further includes many pairs of electrodes 130, for example, the positive electrode is disposed in the first recess 122a of the connecting structure 120, and the negative electrode is disposed in the connecting protruding 124a. And the pair of electrodes 130 are electrically connected to the solar energy module 110 disposed by the connecting structure 120. Therefore, when the connecting structure 120 on one of the solar energy modules 110 is fastened to the first recess 122a of the connecting structure 120 of another solar energy module 110 through the connecting protruding 124a of the connecting belt 124, the electrical connection between the plurality of solar energy modules 110 can be achieved, through the pair of electrodes, respectively located in the first recess 122a and the connecting protruding 124a, being connected to each other.

In addition, since the solar energy device 200 of the present invention is commonly disposed on the ground, when the connecting protruding 124a is fastened to the first recess 122a or the second recess 122b, the distance between the connecting protruding 124a and the solar energy module 110 is smaller than the distance between the top of the first recess 122a of the body 122 and the solar energy module 110, or is smaller than the distance between the top of the second recess 122b of the body 122 and the solar energy module 110. For instance, referring to FIG. 1, after the connecting protruding 124a is fastened to the second recess 122b, the solar energy device 100 placed on the ground is in the status of the first recess 122a being above and the second recess 122b being below, so that the solar energy module 110 can receive lights from the light receiving surface S1. At this moment, since the body 122 located at the back-lighted surface S2 may contact with the ground through the top T2 of the body 122, the top T1 of the connecting protruding 124a fastened to the body 122 has to be lower than the top T2 of the body 122. As such, the pair of electrodes 130 disposed in the connecting protruding 124a and the first recess 122a can be distant from the ground, so as to reduce the bad effect to the electrodes 130 due to humidity. Furthermore as shown in FIG. 5, when the connecting protruding 124a is fastened to the second recess 122b, the structural effect illustrated in FIG. 1 can also be achieved, and a relevant description is omitted.

In light of the foregoing, in the embodiment of the present invention, through the connecting structures disposed at the corners of the solar energy module, the solar energy module is protected due to the buffer effect. By using the configuration of the connecting protruding disposed on the connecting belt of the connecting structure and the recess portions of the body, the adjacent solar energy modules can be connected to each other, and the plurality of the solar energy modules are further electrically and physically connected together through the connecting structure.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A solar energy device, comprising:
   a first and a second solar energy module;
   a first and a second connecting structure, each comprising:
      a body having a first and a second recess; and
      a connecting belt having a first end, a second end and a connecting protrusion located at the second end, wherein the first end is connected to the body;
   wherein the body of the first connecting structure is assembled to the first solar energy module and the first recess of the first connecting structure is located at a light receiving surface of the first solar energy module and the second recess is located at a side of the light receiving surface opposite to the light receiving surface, and the body of the second connecting structure is assembled to the second solar energy module;
   wherein the first connecting structure comprises a first electrode disposed in the first recess thereof and a second electrode disposed in the connecting protrusion thereof and electrically connected to the first solar energy module, and the second connecting structure comprises a first electrode disposed in the first recess thereof and a second electrode disposed in the connecting protrusion thereof, and electrically connected to the second solar energy module;
   wherein the first and second solar energy modules are arranged adjacent to each other, and the first and second connecting structures are configured such that the connecting belt of the first connecting structure is movable between a first position in which the connecting protrusion of the first connecting structure is received in the first recess of the second connecting structure so as to fasten together the first and second connection structures, and a second position in which the connecting protrusion of the first connecting structure is received in the second recess of the first connecting structure.

2. The solar energy device as claimed in claim 1, configured such that the first and second solar energy modules are electrically connected via the first electrode of the second connecting structure and the second electrode of the first connecting structure when the connecting belt of the first connecting structure is in the first position.

3. The solar energy device as claimed in claim 1, configured such that when the connecting belt first of the first connecting structure is moved into the second position, the connecting belt and the connecting protrusion are received in the second recess flush with an outer surface of the body of the first connection structure.

4. The solar energy device as claimed in claim 3, wherein a shape of the connecting protrusion of the first connecting structure is complementary to a shape of the first recess of the second connecting structure.

5. The solar energy device as claimed in claim 1, wherein when the connecting protrusion of the first connecting structure is fastened to the first recess of the second connecting structure, a distance between the connecting protrusion and the second solar energy module is smaller than a distance between a top of the first recess of the body of the second connecting structure and the second solar energy module.

6. The solar energy device as claimed in claim 1, wherein the first solar energy module has a corner, and the body of the first connecting structure encloses the corner.

7. The solar energy device as claimed in claim 6, wherein the body comprises a buffer material.

8. The solar energy device as claimed in claim 7, wherein the connecting belt is flexible.

9. The solar energy device as claimed in claim 1, wherein when the connecting protrusion of the first connecting structure is fastened to the second recess of the first connecting structure, a distance between the connecting protrusion and the first solar energy module is smaller than a distance between a top of the second recess of the body of the first connecting structure and the first solar energy module.

10. A using method of a solar energy device, adapted to connect a plurality of solar energy devices to each other, each solar energy device comprising a solar energy module and a connecting structure assembled to the solar energy module, and the connecting structure comprising a body, a connecting belt and a pair of electrodes, wherein the body has a first recess located at a light receiving surface of the solar energy module and a second recess located at a surface of the solar energy module opposite to the light receiving surface, the connecting belt has a first end, a second end and a connecting protrusion located at the second end, and the first end is connected to the body, the pair of electrodes are respectively disposed at the first recess and the connecting protrusion and electrically connected to the solar energy module, and the connecting protrusion is received in the second recess, the using method of the solar energy device comprising:

detaching the connecting protrusion of a first one of the solar energy devices from the second recess; and fastening said connecting protrusion to the first recess of a second one of the solar energy device so that the solar energy devices are connected to each other.

11. A solar energy device, comprising:

a solar energy module;

a connecting structure, comprising:

a body assembled to the solar energy module, wherein the body has a first and a second recess, wherein the first recess is located at a light receiving surface of the solar energy module and the second recess is located at a side of the light receiving surface opposite to the light receiving surface;

a flexible connecting belt having a first end, a second end and a connecting protrusion located at the second end, wherein the first end is connected to the body;

a first electrode disposed in the first recess; and a second electrode disposed in the connecting protrusion;

configured such that the connecting belt is movable between a first position in which the connecting protrusion is located and a second position in which the connecting protrusion is separated from the second recess.

12. The solar energy device as claimed in claim 11, configured such that when the connecting belt first of the first connecting structure is moved into the first position, the connecting belt and the connecting protrusion are received in the second recess flush with an outer surface of the body of the connecting structure.

13. The solar energy device as claimed in claim 11, wherein a shape of the connecting protrusion is complementary to a shape of the second recess.

\* \* \* \* \*